(12) United States Patent
Inagaki et al.

(10) Patent No.: US 7,691,203 B2
(45) Date of Patent: Apr. 6, 2010

(54) FILM FORMING APPARATUS

(75) Inventors: Toru Inagaki, Sakai (JP); Takahiro Shirahata, Sakai (JP); Takashi Yokoyama, Sakai (JP); Michihiro Sano, Tokyo (JP); Naochika Horio, Tokyo (JP)

(73) Assignee: Air Water Inc. (JP)

( * ) Notice: Subject to any disclaimer, the term of this patent is extended or adjusted under 35 U.S.C. 154(b) by 60 days.

(21) Appl. No.: 11/341,093

(22) Filed: Jan. 27, 2006

(65) Prior Publication Data

US 2007/0175394 A1    Aug. 2, 2007

(51) Int. Cl.
  *C23C 16/22* (2006.01)
  *H01L 21/36* (2006.01)
  *C23C 16/00* (2006.01)

(52) U.S. Cl. .............. 118/715; 118/725; 118/728; 156/345.29; 156/345.33

(58) Field of Classification Search ............ 118/715, 118/725, 728; 156/345.29, 345.33
See application file for complete search history.

(56) References Cited

U.S. PATENT DOCUMENTS

| | | | | |
|---|---|---|---|---|
| 5,044,314 | A | * | 9/1991 | McNeilly .............. 118/715 |
| 5,108,792 | A | * | 4/1992 | Anderson et al. ........ 427/248.1 |
| 5,179,677 | A | * | 1/1993 | Anderson et al. .......... 392/411 |
| 5,192,370 | A | * | 3/1993 | Oda et al. .............. 118/723 R |
| 6,125,788 | A | * | 10/2000 | Hills et al. .............. 156/345.51 |
| 2004/0126952 | A1 | * | 7/2004 | Gondhalekar et al. ....... 438/200 |
| 2004/0231798 | A1 | * | 11/2004 | Gondhalekar et al. ... 156/345.33 |
| 2005/0250341 | A1 | * | 11/2005 | Itatani et al. ............... 438/763 |

FOREIGN PATENT DOCUMENTS

| | | | |
|---|---|---|---|
| JP | 01-101623 | * | 4/1989 |
| JP | 2005-298866 | * | 10/2005 |

* cited by examiner

*Primary Examiner*—Jeffrie R Lund
*Assistant Examiner*—Satish Chandra
(74) *Attorney, Agent, or Firm*—Wood, Phillips, Katz, Clark & Mortimer

(57) ABSTRACT

A film forming apparatus is provided that can prevent source gases from reacting together before reaching the substrate being processed in the apparatus, minimize the influence of the radiation heat from the substrate, and make the gas behavior in the reaction chamber better for crystal film formation. The apparatus forms a film on a surface of a heated substrate 5 by causing a first source gas and a second source gas to react together. The apparatus has a processing chamber 1, in which the substrate 5 is placed. The processing chamber 1 is divided into a heating chamber 1a and a reaction chamber 1b by at least the substrate 5 so that the substrate surface can be exposed to the source gases in the reaction chamber 1b. The apparatus further has an exhaust duct 7, through which the exhaust gas can be discharged. The exhaust duct 7 faces the exposed substrate surface and connects with the reaction chamber 1b. The apparatus further has first supply ports 11 and second supply ports 12, through which the first and second source gases respectively can be supplied independently onto the substrate surface. The supply ports 11 and 12 are positioned outside the exhaust duct 7. This enables the source gases to react immediately near the substrate 5 so that high-quality crystal film formation can be performed on the substrate.

8 Claims, 10 Drawing Sheets

FILM FORMING APPARATUS

FIELD OF THE INVENTION

The present invention relates to an apparatus for forming a film on a substrate from a source gas consisting of at least a first source gas and a second source gas.

BACKGROUND OF THE INVENTION

For example, an apparatus for forming a ZnO epitaxial film for a white light emitting diode (LED) or another light emitting element forms a ZnO film on a substrate by causing source gases react together, which may be an O source gas and a Zn source gas.

The substrate is mounted in the apparatus, in which the source gases are blown through the respective supply ports onto the substrate. The source gases flow through separate passages to the respective supply ports so that the gases cannot react until they reach the ports. However, if the passages are sealed insufficiently, the source gases react together before they reach the supply ports. This results in crystal film formation (of ZnO) on the inside of the passages etc., worsens the gas crystallizability on the substrate, lowers the film growth speed and causes particle deposition.

The source gases flowing from the supply ports toward the substrate react together before they reach the substrate. This results in very small portions of the source gases being consumed for the film formation on the substrate, so that the formation requires a great quantity of source gas and a long time.

In particular, if one of the source gases is an O source gas ($O_2$, $H_2O$, $N_2O$ or the like), it is apt to react in its gaseous phase with the other, so that high-quality crystal film formation cannot be performed on the substrate. This problem is difficult to solve because the O source gas is highly reactive even if the reaction chamber of the apparatus is in a high-vacuum state. The problem is more difficult to solve if the reaction chamber is in a low-vacuum state, which makes the O source gas more reactive.

The supply ports are positioned where they are subject to the radiation heat from the substrate, so that the source gases start to react immediately after they leave the ports. This worsens the gas crystallizability on the substrate.

In the reaction chamber, while the source gases are flowing toward the substrate, they are induced by the exhaust suction. Consequently, part of the source gases forms a reaction product near the substrate before they form a film on the substrate. This likewise worsens the gas crystallizability on the substrate, lowers the film growth speed and causes particle deposition.

Patent Document 1: Japanese Patent No. 3,198,956

Patent Document 2: Japanese Unexamined Patent Publication No. H1-101623

In order to perform high-quality crystal film formation on the substrate, it is necessary to completely seal the passages for the source gases in the apparatus so that the gases cannot react while flowing through the passages. It is also necessary to prevent the source gases from reacting too early while flowing from the supply ports to the substrate. It is important to position the supply ports so as to minimize the influence of the radiation heat from the substrate. It is further necessary to prevent the behavior of the source gases in the reaction chamber from being disturbed by the exhaust suction.

SUMMARY OF THE INVENTION

In consideration of the foregoing circumstances, it is the object of the present invention to provide a film forming apparatus that can prevent source gases from reacting together before crystal film formation on the substrate being processed in the apparatus, minimize the influence of the radiation heat from the substrate, and make the gas behavior in the reaction chamber better for crystal film formation.

A film forming apparatus according to the present invention forms a film on a surface of at least one heated substrate by causing a plurality of source gases, which include at least a first source gas and a second source gas, to react together. The apparatus has a processing chamber, in which the substrate is placed. The processing chamber is divided into a heating chamber and a reaction chamber by at least the substrate so that the substrate surface can be exposed to the source gases in the reaction chamber. The apparatus further has an exhaust duct, through which the exhaust gas can be discharged. The exhaust duct faces the exposed substrate surface and connects with the reaction chamber. The apparatus further has at least one first supply port and at least one second supply port, through which the first and second source gases respectively can be supplied independently onto the substrate surface. The first and second supply ports are positioned outside the exhaust duct.

Because the heating and reaction chambers are divided by at least the substrate, the source gases having reached the substrate do not flow into the heating chamber and other places after the crystal film formation on the substrate. Accordingly, no reaction product sticks to the parts other than the substrate. Immediately after the crystal film formation, the source gases are sucked with the exhaust gas flow through the exhaust duct, which faces the substrate. This makes the flow of the source gases in good order and improves their circulation.

Because the supply ports are positioned outside the exhaust duct, they are less subject to the radiation heat from the substrate. As a result, the vicinity of the supply ports is kept cool, so that the source gases are less reactive until they reach the substrate even if portions of them are mixed. This makes it possible to increase the quantities of source gases used for crystal film formation. Specifically, the supply ports are positioned outside a virtual extension of the exhaust duct into the reaction chamber and open into this chamber.

The first and second source gases flow out of the first and second supply ports respectively. This reduces the quantities of source gases mixed together while the gases are flowing from the supply ports to the substrate. This greatly reduces the quantities of source gases that start to react together before the gases reach the substrate. Turbulence is created in the source gases blown onto the substrate, and they start to react at the place nearest to the substrate. While the reaction product formed by the reaction is expanding circumferentially of the substrate and toward the center of the substrate, crystal film formation is performed all over the substrate. Thus, the most portions of the source gases having flowed out of the supply ports are used for crystal film formation. The exhaust gas flows from the vicinity of the center of the substrate into the exhaust duct.

The substrate may be placed in a substantially circular placing region in the film forming apparatus. The exhaust duct, which connects with the reaction chamber, may be substantially cylindrical and coaxial with the placing region.

In this case, after a film is formed on the substrate out of the source gases having flowed out of the supply ports, the exhaust gas can be sucked and discharged from the vicinity of the center of the placing region toward the exhaust duct.

The film forming apparatus may have a peripheral wall formed outside the supply ports for reducing the peripheral space in the reaction chamber. This makes it possible to reduce the quantities of source gases that do not function effectively in the reaction chamber. This also makes it possible to improve the gas crystallizability on the substrate and raise the film growth speed. The orientation of the peripheral wall may be varied so that the wall can function as a rectifier for the source gases. This results in good gas flow toward the substrate.

The film forming apparatus may have a plurality of first supply ports and a plurality of second supply ports, through which the first and second source gases respectively can be supplied independently onto the substrate surface. The first and second supply ports are positioned outside the exhaust duct and alternate on a circumference. In this case, the first and second source gases alternately reach predetermined places on the substrate, so that the gases react uniformly at places close to the substrate. This is effective in uniformizing the quality of film formation.

If the first supply ports and second supply ports are equally spaced, the first and second source gases reach the predetermined places on the substrate regularly at regular intervals. This is more effective in uniformizing the quality of film formation.

The supply ports may be formed through an annular member, which forms a part of the reaction chamber, widens toward the substrate and connects with the exhaust duct. This results in the supply ports being positioned where they are less subject to the radiation heat from the substrate. Consequently, the vicinity of the supply ports is kept cool, so that the source gases are less reactive until they reach the substrate even if portions of them are mixed. This makes it possible to increase the quantities of source gases used for crystal film formation.

The film forming apparatus may have a first annular diffusion chamber and a second annular diffusion chamber for distributing the first and second source gases respectively to the first and second supply ports respectively. The first and second source gases can be supplied from the first and second annular diffusion chambers respectively through independent channels to the first and second supply ports respectively. Accordingly, the channels for the source gases are isolated completely from each other from the diffusion chambers to the supply ports, so that the gases do not react together while flowing in the channels. The annular diffusion chambers can be well parallelized with the annular member, through which the supply ports are formed. This makes it possible to simplify the piping from the diffusion chambers to the supply ports. This also makes it possible to uniformize the length of the piping, thereby making it easy to uniformize the quantities of gas flowing out of the supply ports.

If the annular diffusion chambers surround the exhaust duct, the chamber and the duct are well arranged, so that the film forming apparatus is compact.

The sectional area of the exhaust duct may be larger than the area of the placing region, in which the substrate exposed to the source gases in the reaction chamber is placed. In this case, after a film is formed on the substrate out of the source gases having flowed out of the supply ports, the exhaust gas can be sucked and discharged from the vicinity of the placing region toward the exhaust duct. A plurality of substrates may be placed in the placing region so that films can be formed at once on them. Particularly in this case as well, the exhaust gas can be sucked and discharged from the center of the placing region after the film formation out of the source gases. This is effective in improving the gas crystallizability, the film growth speed, etc.

A plurality of substrates may be so positioned that the source gases supplied through each of the first supply ports and each of the second supply ports flow substantially perpendicularly to the surface of one of the substrates. In this case, the source gases reach the substrates in the most effective directions for the formation of reaction products, so that the gases are very high in crystallizability.

BEST MODE OF THE INVENTION

Figure 1:
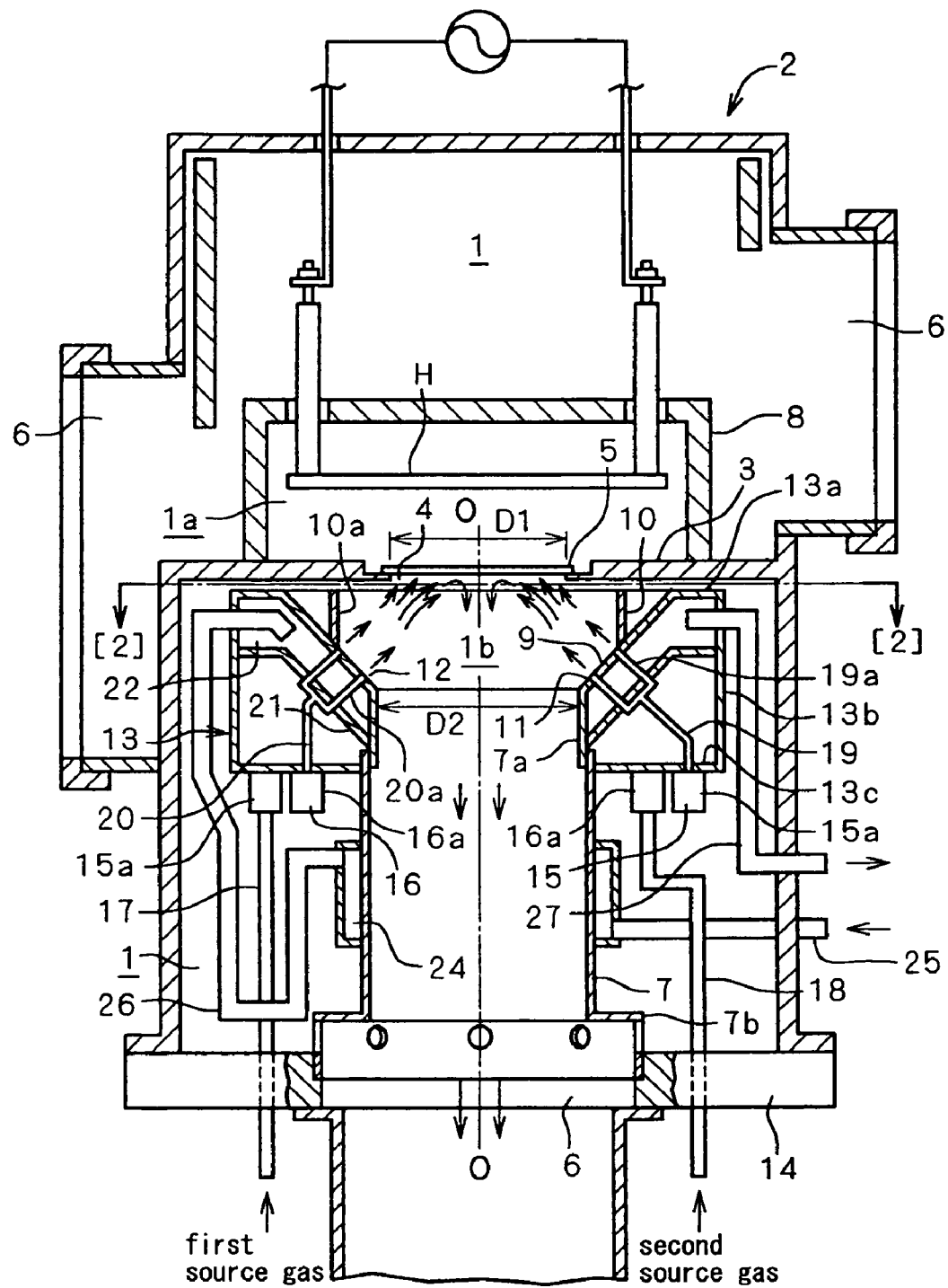
FIG. 1 is a sectional view of a film forming apparatus as a first embodiment of the present invention.

The best mode of the present invention will be described below.

Embodiment 1

FIGS. 1-4 show a film forming apparatus as an embodiment of the present invention.

The film forming apparatus includes a processing container 2 defining a processing chamber 1 in it. A partition plate 3 is provided in the processing container 2 and has a circular opening 4 formed through it. A circular sapphire substrate 5 in the form of a plate to be processed is placed on the partition plate 3 concentrically with it. A heater H is positioned over the back side of the sapphire substrate 5 and surrounded by a reflector 8, which defines a heating chamber 1a within it. The portion of the processing chamber 1 that is positioned under the partition plate 3 and sapphire substrate 5 is a reaction chamber 1b, which can be supplied with various processing gases. The processing chamber 1 has exhaust ports 6, through which a vacuum pump (not shown) creates a vacuum in this chamber. If the sapphire substrate 5 is large in area, only it can isolate the heating chamber 1a and reaction chamber 1b from each other.

Figure 2:
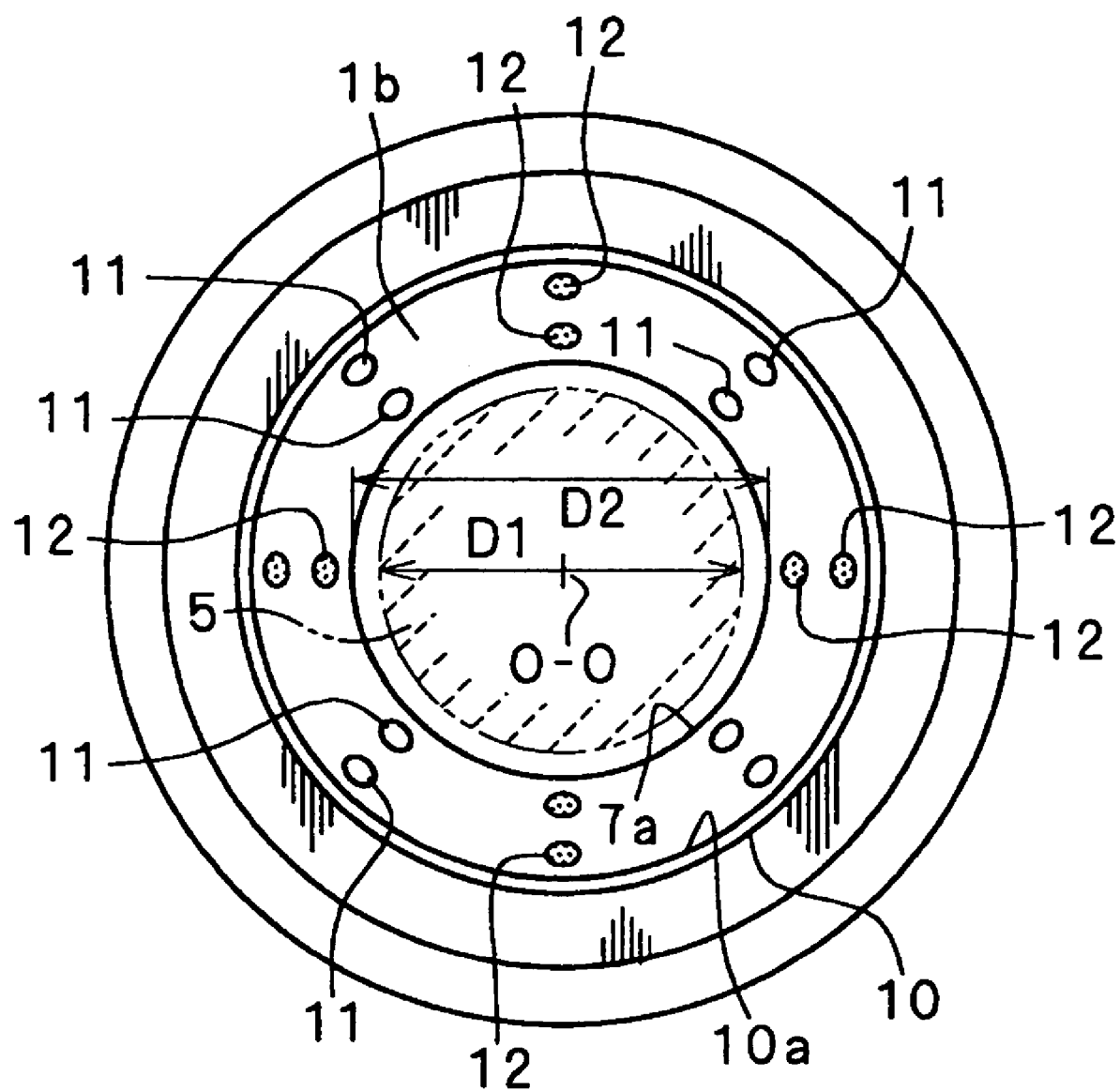
FIG. 2 is a sectional view of the film forming apparatus taken on line 2-2 in FIG. 1.

An annular box 13 is positioned immediately under the partition plate 3 for forming the reaction chamber 1b, a cooling jacket 22, etc. and connecting an annular member 9 and an exhaust duct 7. The reaction chamber 1b is formed inside the annular box 13. As shown in FIG. 1, the reaction chamber 1b is a space positioned immediately under the sapphire substrate 5 and connected to the exhaust duct 7, which extends downward from the bottom opening of the annular box 13 and communicates with the bottom exhaust port 6. As shown in FIG. 2, the exhaust duct 7 is cylindrical and includes a top part 7a, which is part of the annular box 13. The exhaust duct 7 has an axis 0-0 and is substantially coaxial with the sapphire substrate 5 in the form of a disk, which is exposed to the gases in the reaction chamber 1b through the circular opening 4.

In this embodiment, one sapphire substrate 5 is coaxial with the exhaust duct 7 and placed in a circular placing region, which is coaxial with the duct 7.

As shown in FIGS. 1 and 2, the diameter D1 of the circular sapphire substrate 5, which is exposed to the gases in the reaction chamber 1b, is smaller than the inner diameter D2 of the exhaust duct 7.

The reaction chamber 1b consists mainly of the annular member 9 and a wall member 10. The annular member 9 has a surface that is conical and widens toward the sapphire substrate 5. More specifically, the annular member 9 has radially spaced top and bottom ends, with the surface on the annular member 9 widening from its bottom end towards its top end in the direction of the substrate 5. The bottom of the annular member 9 connects with the top of the exhaust duct 7. The wall member 10 is a partition for reducing the dead space in the reaction chamber 1b. The partition 10 is located between the top and bottom ends of the annular member 9. The inner surface 10a of the wall member 10 functions to reduce the peripheral space in the reaction chamber 1b. As shown in FIG. 2, the wall member 10 is a short cylindrical member. The annular member 9 and wall member 10 are coaxial with the exhaust duct 7. Accordingly, the reaction chamber 1b is circular in cross section and coaxial with the exhaust duct 7.

In this embodiment, the source gases are an O source gas and a Zn source gas. The O source gas may be $O_2$, $H_2O$ or $N_2O$. The Zn source gas may be DEZn (diethyl zinc).

The annular member 9 has pairs of supply ports 11 and 12 formed through the annular member 9 and the conical surface thereon. The O source gas as a first source gas and the Zn source gas as a second source gas flow out of the supply ports 11 and 12 respectively toward the sapphire substrate 5. The supply ports 11 and 12 are positioned radially outside the exhaust duct 7. Specifically, the supply ports 11 and 12 are positioned outside a virtual space that would be formed in the reaction chamber 1b, and that is coaxial with the exhaust duct 7 and has a diameter equal to the inner diameter D2 of the duct. That is, the supply ports 11, 12 reside outside the radius of the sectional area of the exhaust duct 7 as measured from the central axis of the exhaust duct 7.

As shown in FIG. 2, the supply ports 11 or 12 in each pair are aligned radially of the annular member 9, and the pairs of supply ports 11 and 12 are arranged alternately at regular intervals circumferentially of this member 9. For easy distinction between the supply ports 11 and 12, only the ports 12 are dotted in FIG. 2. Alternatively, each pair of supply ports 11 and 12 could be replaced by one, three or more supply ports.

The annular box 13 consists of the annular member 9, a top annular plate 13a in the form of a flat plate, and outer cylindrical wall 13b, a bottom annular plate 13c in the form of a flat plate, and the top part 7a of the exhaust duct 7. The top of the annular member 9 connects with the inner edge of the top annular plate 13a. The outer edges of the annular plates 13a and 13c connect with the top and bottom respectively of the outer cylindrical wall 13b. The bottom of the exhaust duct 7 connects with an annular support member 7b, the bottom of which is fixed to an annular base plate 14 that is thick and rigid. Thus, the annular box 13, which has reaction chamber 1b, supply ports 11 and 12, etc., is joined firmly to the base plate 14 with the exhaust duct 7 and support member 7b. This results in the film forming apparatus being rigid. Because the processing container 2 as well is joined to the base plate 14, it is possible to accurately position the reaction chamber 1b relative to the partition plate 3 and circular opening 4, which are formed in a portion of the processing container 2. This enables a reaction gas to accurately reach the sapphire substrate 5, so that a film of good quality can be formed.

As shown in FIGS. 4A and 1, annular ducts 15a and 16a are joined to the bottom annular plate 13c of the annular box 13 and have annular diffusion chambers 15 and 16 respectively formed in them. The annular duct 15a is larger in diameter than the annular duct 16a and surrounds it. Alternatively, the annular ducts 15a and 16a could be equal in diameter, and one of them could be positioned over the other. The annular ducts 15a and 16a surround the exhaust duct 7. A supply pipe 17 and a supply pipe 18 for the first (O) source gas and the second (Zn) source gas, respectively, extend from the outside into the film forming apparatus and are connected to the bottoms of the diffusion chambers 15 and 16, respectively. Supply pipes 19 and 20 are connected to the tops of the diffusion chambers 15 and 16, respectively, and extend in the annular box 13. Each of the supply pipes 19 branches out into two pipe lines 19a, which connect with the supply ports 11 in one pair. Likewise, each of the supply pipes 20 branches out into two pipe lines 20a, which connect with the supply ports 12 in one pair. As shown in FIG. 4B, the annular ducts 15a and 16a could be an integral annular casting having an outer groove and an inner groove formed as diffusion chambers 15 and 16, respectively.

Figure 3:
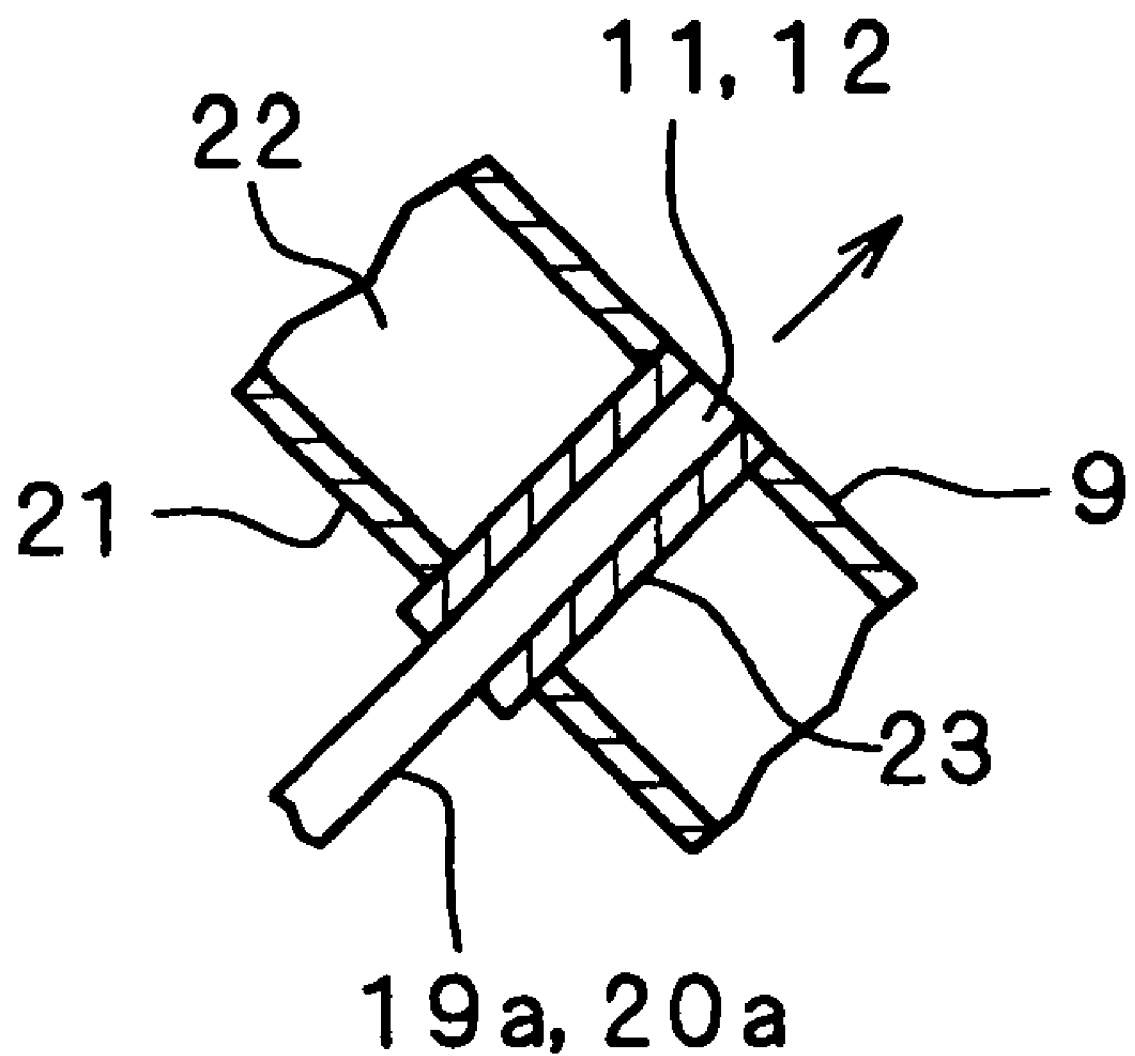
FIG. 3 is a sectional view of a portion of the cooling jacket of the film forming apparatus.
Figure 4:
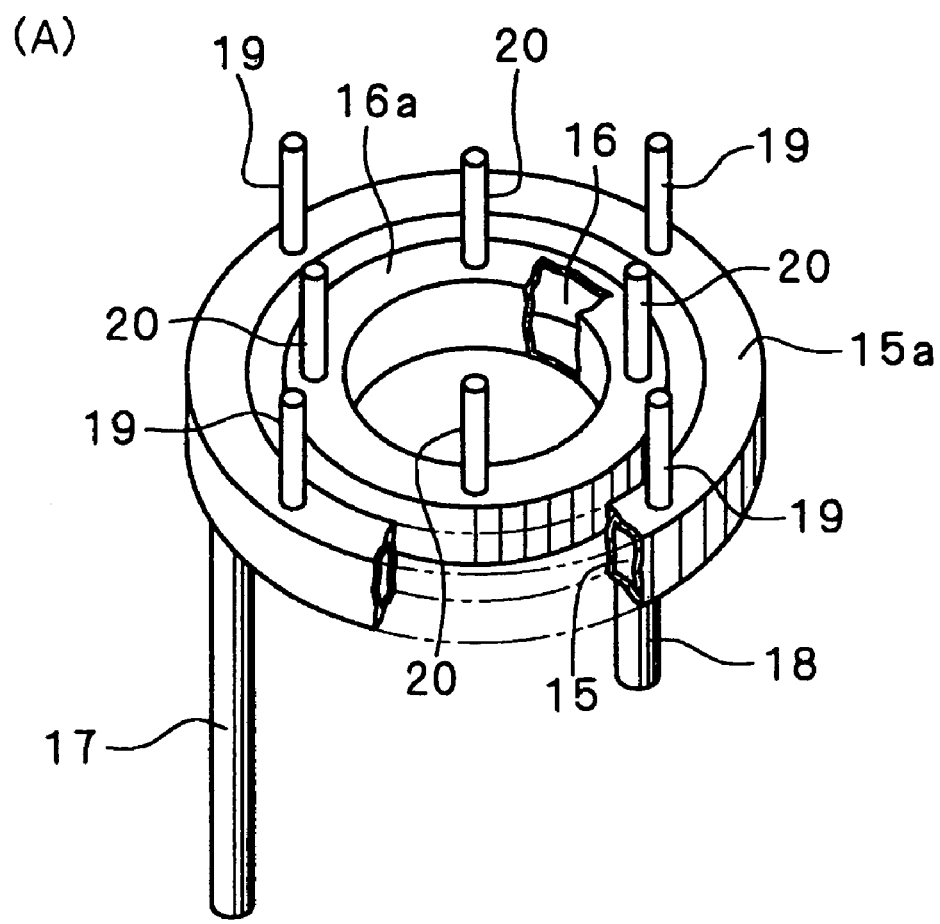
FIG. 4A is a perspective view of the diffusion chambers of the film forming apparatus.
FIG. 4B is a sectional view of the diffusion chambers.
Figure 4:
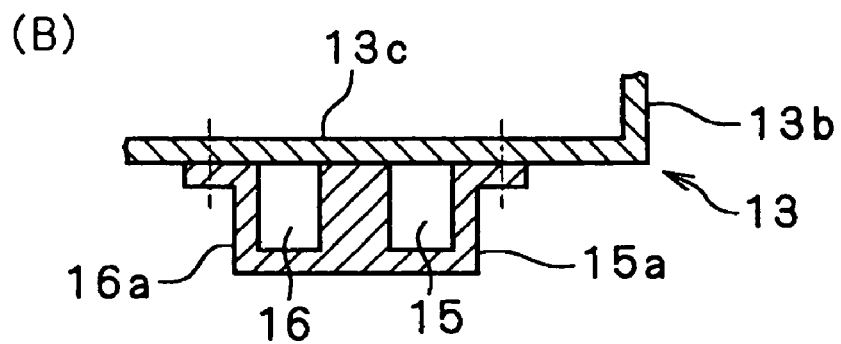

As shown in FIGS. 1 and 3, the annular box 13 also includes a partition wall 21, which is nearly identical in shape with the annular member 9 and positioned around and under it. The cooling jacket 22, in which cooling liquid flows, is formed between the annular member 9 and partition wall 21. Sealed straight ducts 23 extend through the cooling jacket 22 between the annular member 9 and partition wall 21. Each of the pipe lines 19a and 20a is connected to one of the straight ducts 23. The outlet of each straight duct 23 is the associated supply port 11 or 12. The source gases flow out of the straight ducts 23 into the reaction chamber 1b, so that gas flow directivity is produced in it.

A cooling jacket 24 is formed on the periphery of the exhaust duct 7. An inlet pipe 25 extends from the outside into the film forming apparatus and is connected to the cooling jacket 24, which is connected to the cooling jacket 22 by a connecting pipe 26. An outlet pipe 27 is connected to the cooling jacket 22 and extends out of the film forming apparatus. The cooling liquid flows from the inlet pipe 25 into the cooling jacket 24, where it cools the gas in the exhaust duct 7. The cooling liquid further flows into the cooling jacket 22, where it cools the pipe lines 19a and 20a and reaction chamber 1b. Subsequently, the cooling liquid flows out through the outlet pipe 27.

The operation and advantages of this embodiment will be described below.

The first and second source gases are supplied separately through the independent supply pipes 17 and 18 to the diffusion chambers 15 and 16, respectively, from which the first and second source gases are supplied through the separate supply pipes 19 and 20 to the supply ports 11 and 12, respectively. Thus, the channel through which each source gas flows from the associated supply pipe 17 or 18 to the associated supply ports 11 or 12 is completely separate from the channel through which the other source gas flows likewise. This prevents the source gases from reacting together while they are flowing through the channels.

The straight ducts 23 in the annular box 13 give the source gases flowing separately out of the supply ports 11 or 12 directivity in the directions in which the gases flow out. As a result, very small portions of the source gases having flowed out of the supply ports 11 or 12 start reacting before the gases reach the sapphire substrate 5. It is preferable that the source gases be blown out of the supply ports 11 or 12, from outside a radius of the surface of the sapphire substrate 5 that is exposed in the reaction chamber, toward a peripheral portion of the sapphire substrate 5. Turbulence is created in the source gases blown onto the peripheral portion of the sapphire substrate 5, and the gases start reacting at the place nearest to the substrate 5. While the reaction product formed by the reaction is expanding circumferentially of the sapphire substrate 5 and toward the center of the substrate, crystal film formation is performed all over the substrate 5. Thus, the most portions of the source gases having flowed out of the supply ports 11 or 12 are used for crystal film formation. The exhaust gas flows from the vicinity of the center of the sapphire substrate 5 toward the exhaust duct 7.

The supply ports 11 and 12 for the source gases open into the reaction chamber 1b outside the virtual space that would be formed in the chamber 1b, and that is coaxial with the exhaust duct 7 and has a diameter equal to the inner diameter of the duct 7. Accordingly, the supply ports 11 and 12 are less subject to the radiation heat from the sapphire substrate 5. As a result, the vicinity of the supply ports 11 and 12 is kept cool, so that the source gases are less reactive until they reach the sapphire substrate 5 even if portions of them are mixed. This makes it possible to increase the quantities of source gases used for crystal film formation.

The heating chamber 1a and reaction chamber 1b are isolated from each other by the partition plate 3 and sapphire substrate 5. The source gases having reached the sapphire substrate 5 do not flow into the heating chamber 1a and other places after the crystal film formation on the substrate. Accordingly, no reaction product sticks to the parts other than the sapphire substrate 5. Immediately after the crystal film formation, the source gases are sucked with the exhaust gas flow. This improves the circulation of the source gases.

The inner surface 10a of the wall member 10 reduces the peripheral space in the reaction chamber 1b by confining the source gases within a radius bounded by the surface 10a measured from the central axis of the exhaust duct. This surface 10a is located radially outside of and adjacent locations where the supply ports 11, 12 communicate with the reaction chamber 16. This makes it possible to reduce the quantities of source gases that do not function effectively in the reaction chamber 1b. This also makes it possible to improve the crystallizability on the sapphire substrate 5 and raise the film growth speed.

The supply ports 11 and 12 alternate at regular intervals circumferentially of the annular member 9. Accordingly, the first and second source gases reach the sapphire substrate 5 regularly and alternately, so that they react uniformly at places close to the substrate 5. This is effective in uniformizing the film forming quality.

The supply ports 11 and 12 are formed through the annular member 9, which is conical and widens toward the sapphire substrate 5. Accordingly, the supply ports 11 and 12 can be positioned where they are less subject to the radiation heat from the sapphire substrate 5. As a result, the vicinity of the supply ports 11 and 12 is kept in low-temperature condition, so that the source gases are less reactive until they reach the sapphire substrate 5 even if portions of them are mixed. This makes it possible to increase the quantities of source gases used for crystal film formation.

The first and second source gases are supplied through the diffusion chambers 15 and 16 and independent supply pipes 19 and 20 to the supply ports 11 and 12, respectively. Accordingly, the passages for the source gases are completely separate from each other from the diffusion chambers 15 and 16 to the supply ports 11 and 12, so that the gases cannot react in the separate passages. The diffusion chambers 15 and 16 are defined by the annular ducts 15a and 16a, respectively. Accordingly, the diffusion chambers 15 and 16 are parallelized with the annular member 9, through which the supply ports 11 and 12 are formed. This makes it possible to simplify the piping from the diffusion chambers 15 and 16 to the supply ports 11 and 12, respectively. This also makes it possible to uniformize the length of the piping, thereby making it easy to uniformize the quantities of gas flowing out of the supply ports 11 and 12.

For example, the mean free path of Zn source gas (DEZn gas) molecules in a high vacuum of $10^{-3}$–1 Pa ($10^{-5}$–$10^{-2}$ Torr) is about 50-100 mm. Accordingly, it is demanded to lengthen the mean free path so as to inhibit the Zn source gas from reacting with the O source gas (for example, $O_2$, $H_2O$ or $N_2O$) while flowing from the supply ports 11 and 12 to the sapphire substrate 5. Therefore, it is preferable that the mean free path of the Zn source gas be as long as possible without the gas reactivity inhibited within the foregoing range of vacuum pressure. Specifically, it is preferable that the mean free path be 50 or more mm. It is more preferable that the mean free path be 70 or more mm. It is much more preferable that the mean free path be 100 or more mm.

A Zn source gas dissolves at a temperature of 200-300 degrees C. and condenses when it is cooled. Accordingly, the cooling control of the cooling jacket 22 etc. is performed so that the temperature of the Zn source gas is about 100 degrees C.

The annular member 9 and supply ports 11 and 12 are positioned in the annular box 13. The cooling jacket 22 is formed in the annular box 13. The annular ducts 15a and 16a are fitted to the annular box 13. Thus, the annular box 13 is the structural core of the film forming apparatus. Accordingly, the film forming apparatus can be constructed with its most important functional parts compactly intensive in structure.

Embodiment 2

Figure 5:
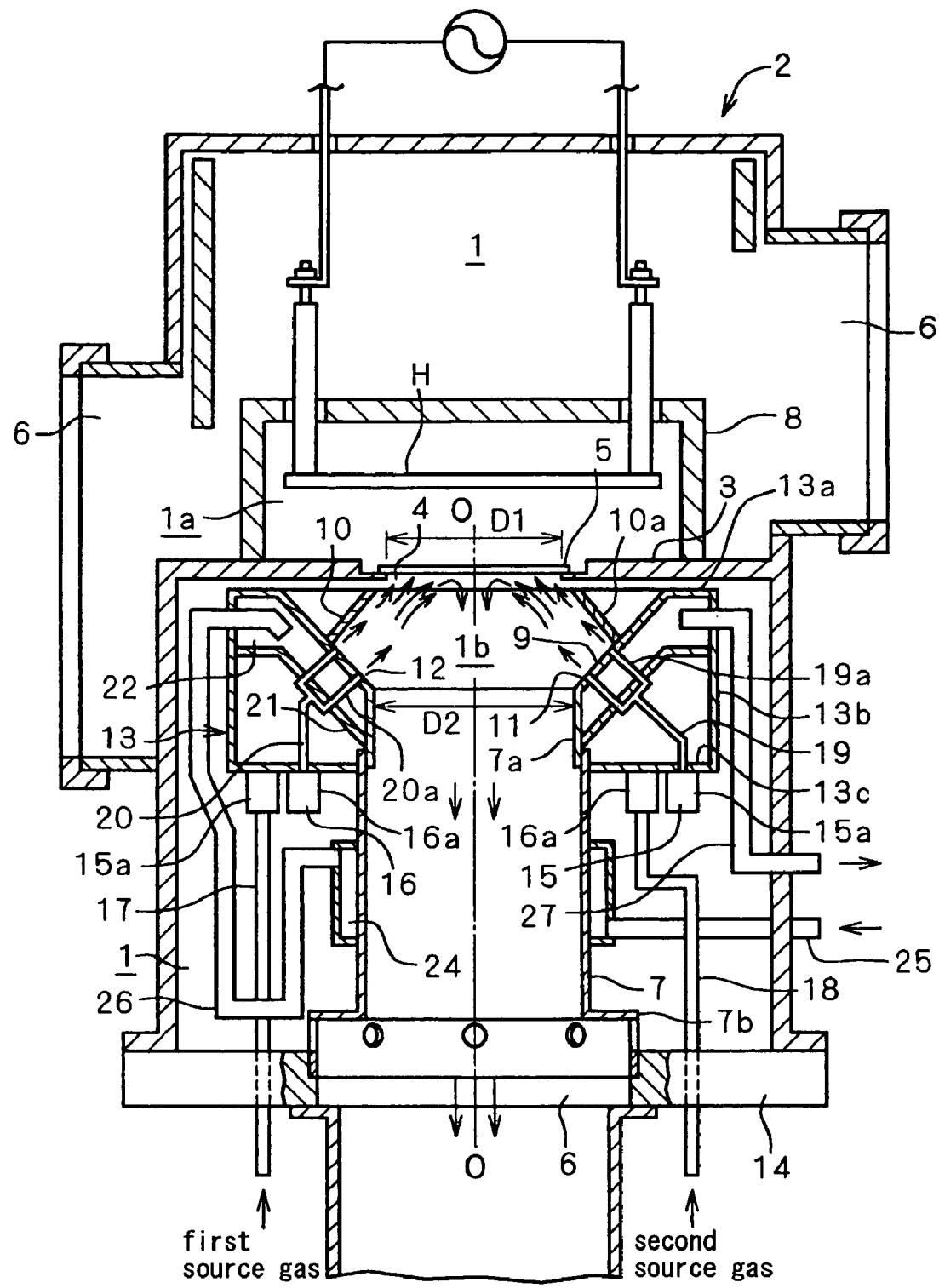
FIG. 5 is a sectional view of a film forming apparatus as a second embodiment of the present invention.
Figure 6:
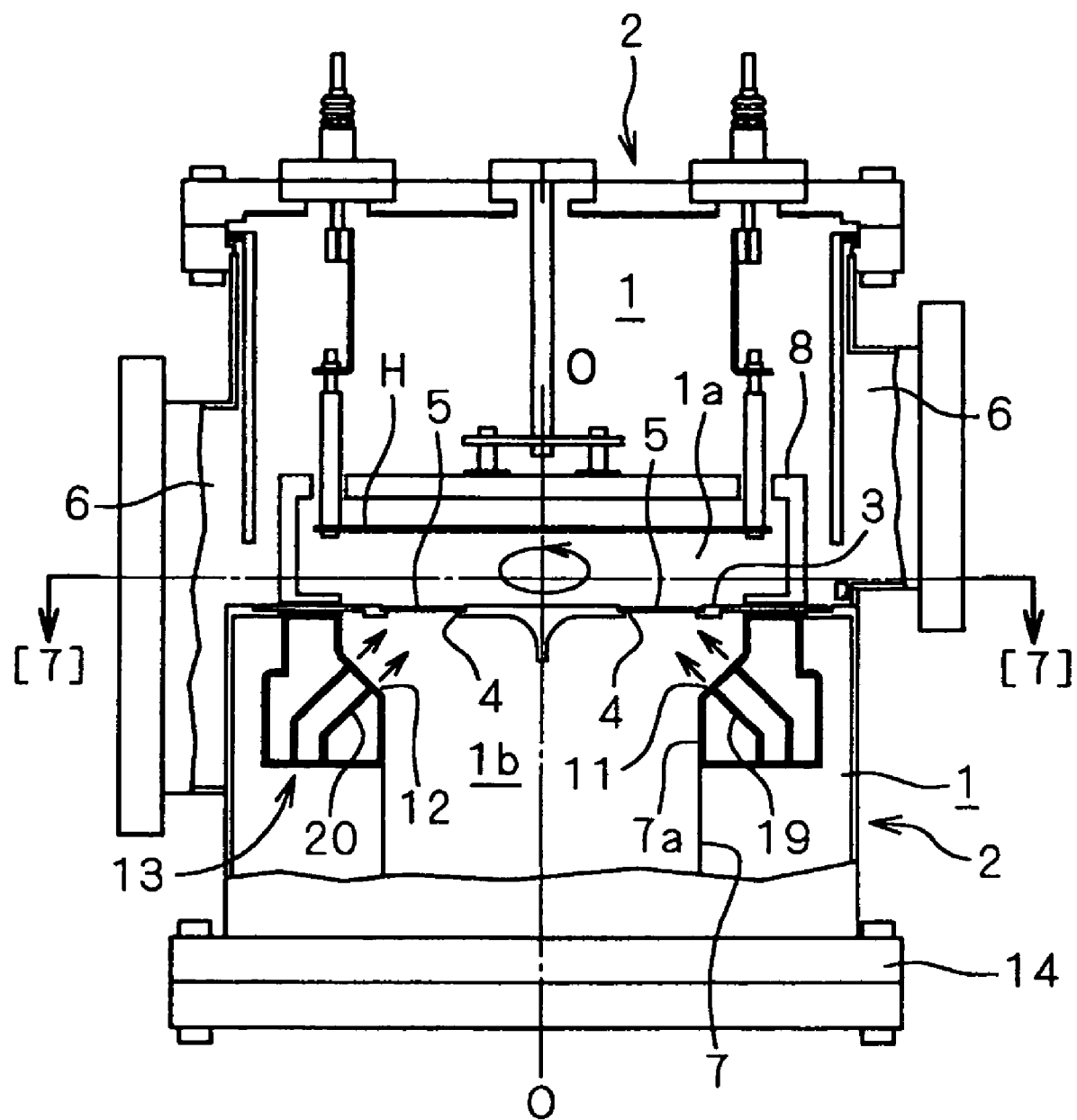
FIG. 6 is a sectional view of a film forming apparatus as a third embodiment of the present invention.

FIG. 5 shows a film forming apparatus as a second embodiment of the present invention.

The annular wall member 10 of this embodiment is conical and smaller in diameter toward the sapphire substrate 5. Otherwise, this embodiment is similar to the first embodiment. The parts of this embodiment that are similar to the counterparts in the first embodiment are assigned the same reference numerals as the counterparts are assigned.

The conical wall member 10 further reduces the peripheral space in the reaction chamber 1b. The inner surface 10a of this wall member 10 rectifies the gas flow from the supply ports 11 and 12. The rectified gas flow interferes with the under surface of the sapphire substrate 5, so that a film of high quality can be formed on the substrate 5. Otherwise, the operation and advantages of this embodiment are similar to those of the first embodiment.

Embodiment 3

FIGS. 6-9 show a film forming apparatus as a third embodiment of the present invention.

Figure 7:
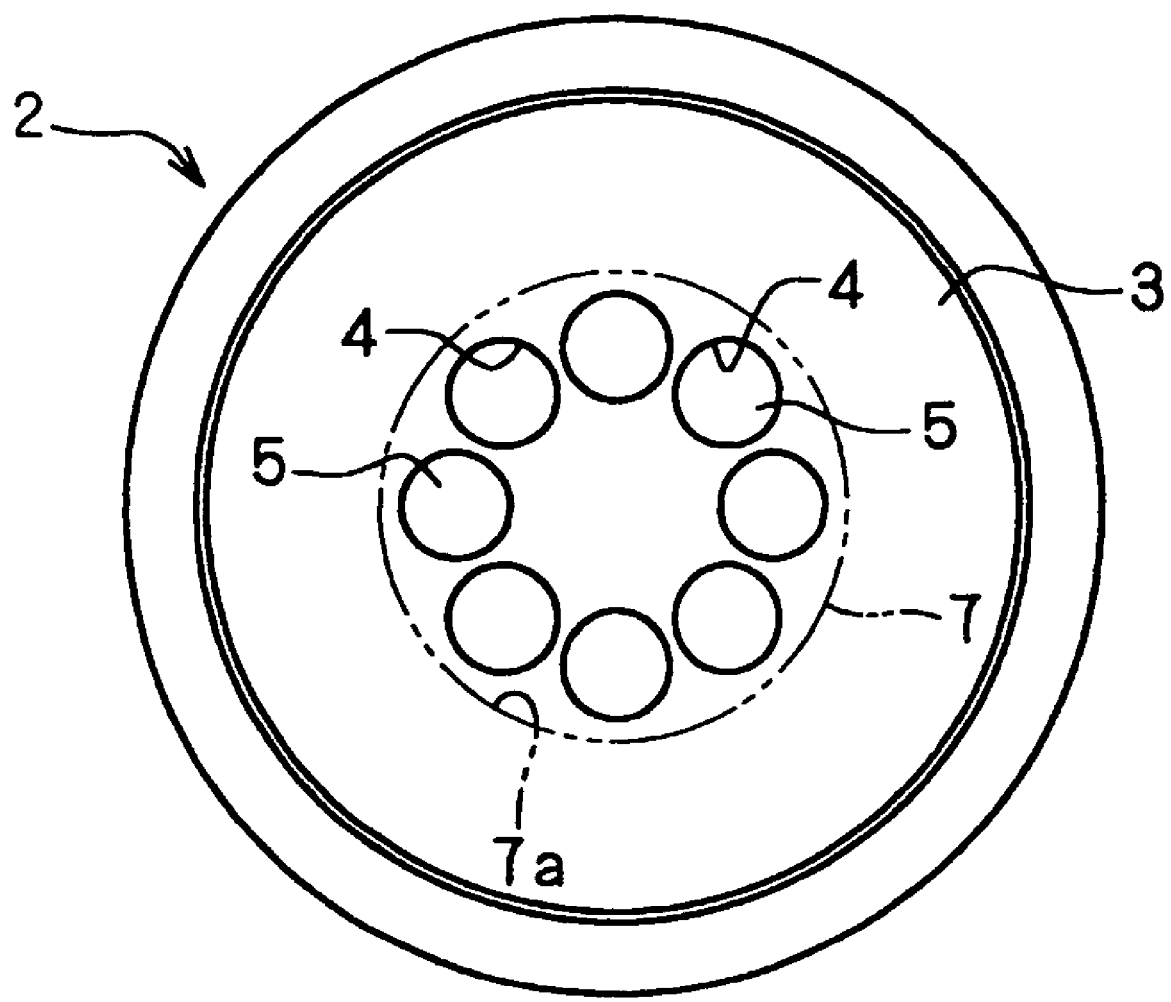
FIG. 7 is a sectional view taken on line 7-7 in FIG. 6.

In this embodiment, eight sapphire substrates 5 are placed in a placing region. Therefore, the partition plate 3 has eight circular openings 4 formed through it at circumferential intervals around the axis 0-0. The placing region is circular, and its center is aligned with the axis 0-0. As shown in FIG. 7, the partition plate 3 is circular and can be rotated around the axis 0-0 by a suitable drive mechanism. For example, a shaft (not shown) may be fixed to the center of the partition plate 3 and rotated. The radially sectional area of the exhaust duct 7 is larger than the area of the placing region, where the sapphire substrates 5 exposed to the gases in the reaction chamber 1b are placed.

Figure 8:
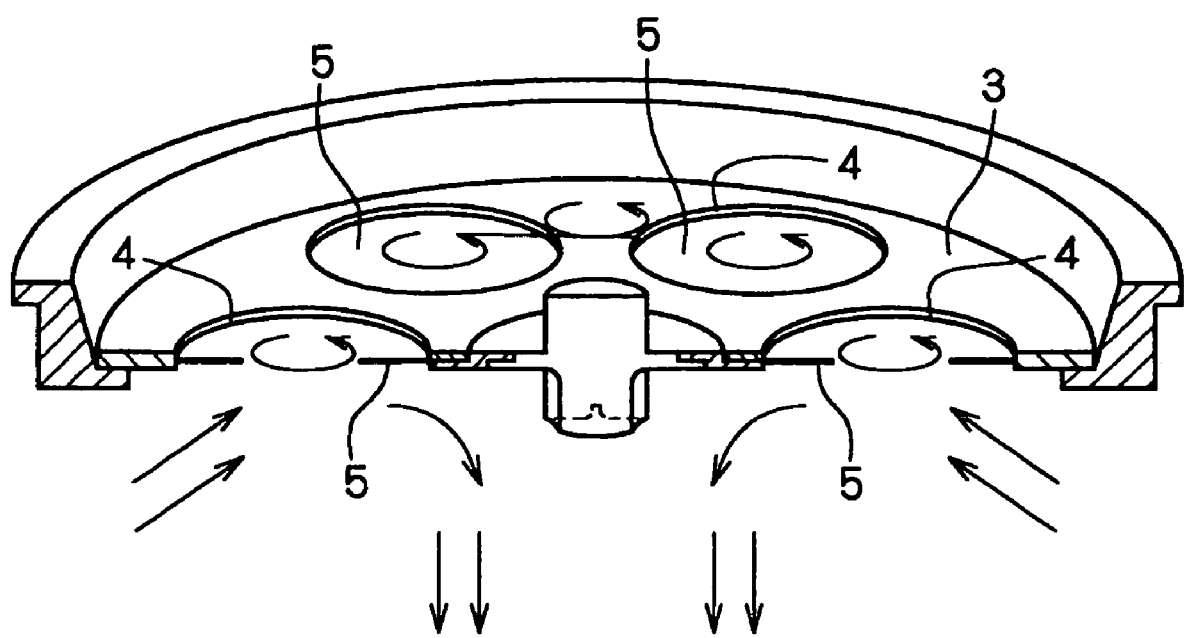
FIG. 8 is a sectional view of a partition plate, on which sapphire substrates are set.
Figure 9:
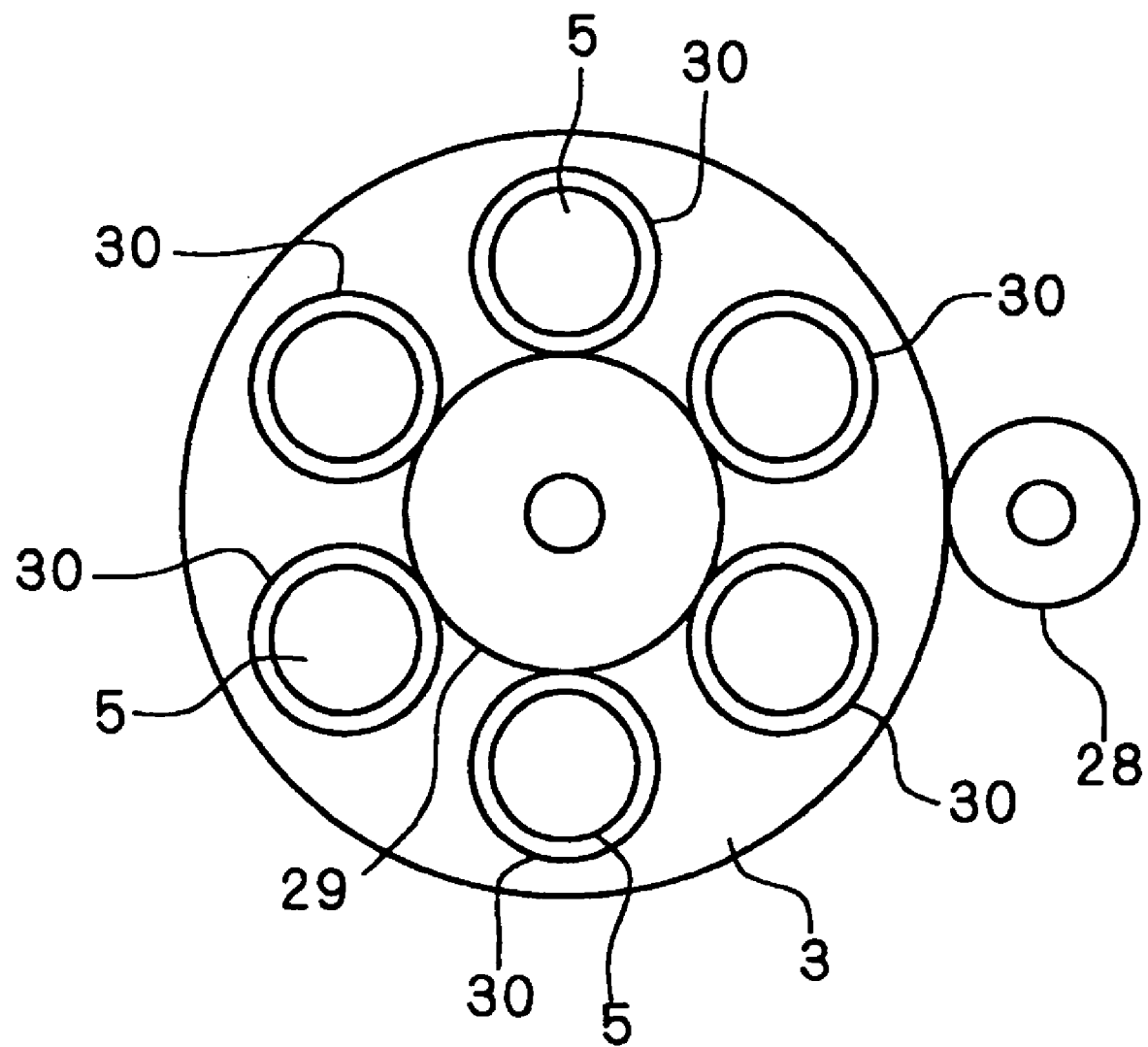
FIG. 9 is a sectional view of a partition plate, schematically showing a driving mechanism for revolving sapphire substrates around the center of the partition plate while rotating them on their respective axes.

FIGS. 8 and 9 show a film forming apparatus in which the partition plate 3 can be rotated on its axis, and in which the sapphire substrates 5 can be rotated on their respective axes by a suitable drive mechanism. For example, as shown in FIG. 9, the drive mechanism may include a driving gear 28, a sun gear 29 and planet gears 30. The driving gear 28 rotates the partition plate 3. The sun gear 29 is fixed coaxially with the partition plate 3 and engages with the planet gears 30, which are supported rotatably on the partition plate 3. Each planet gear 30 has a circular opening 4 formed through it, at which a sapphire substrate 5 is placed. The rotation of the driving gear 28 rotates the partition plate 3 coaxially with the sun gear 29. The rotation of the partition plate 3 revolves the planet gears 30 around the sun gear 29 and rotates them on their respective axes, thereby rotating the sapphire substrates 5 on their respective axes. Otherwise, this embodiment is similar to the foregoing embodiments. The parts of this embodiment that are similar to the counterparts in the foregoing embodiments are assigned the same reference numerals as the counterparts are assigned.

As the sapphire substrates 5 revolve around the axis 0-0 and may rotate on their respective axes, the source gases interfere uniformly with the substrates 5 so that films of uniform and good quality can be formed on the substrates. After films are formed on the sapphire substrates 5 out of the source gases having flowed out of the supply ports 11 and 12, the exhaust gas can be sucked and discharged from a roughly central portion of the placing region toward the exhaust duct 7. In particular, after films are formed out of the source gases at once on all sapphire substrates 5, which are placed in the placing region, the exhaust gas can be sucked and discharged from a central portion of the placing region. This is effective for the improvement of crystallizability, film growth speed, etc. Otherwise, the operation and advantages of this embodiment are similar to those of the foregoing embodiments.

Embodiment 4

Figure 10:
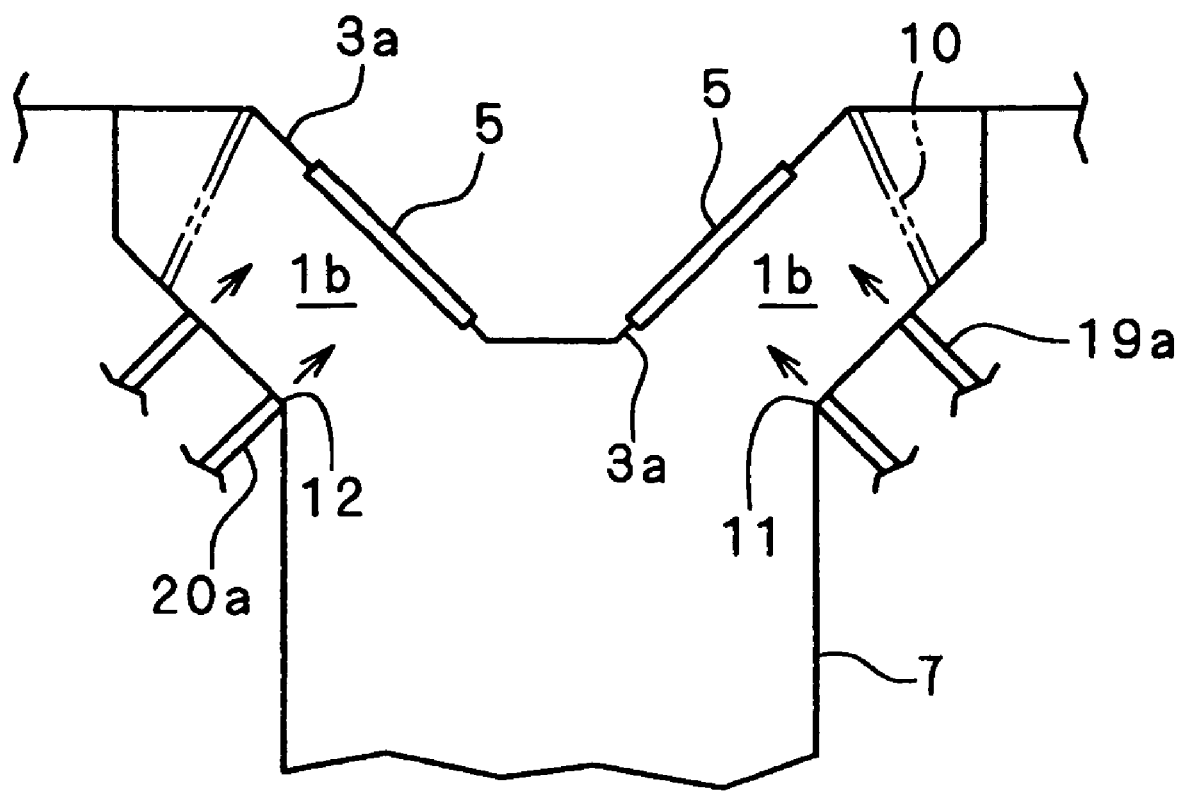
FIG. 10 is a schematic sectional view of a portion of a film forming apparatus as a fourth embodiment of the present invention.

FIG. 10 shows a film forming apparatus as a fourth embodiment of the present invention.

In this embodiment, each sapphire substrate 5 is positioned with its surfaces substantially perpendicular to the direction in which source gases flow out of supply ports 11 and 12. The sapphire substrates 5 are supported on a conical partition plate 3a, which faces the conical member 9. The partition plate 3a is inclined so that the surfaces of each sapphire substrate 5 are substantially perpendicular to the direction in which source gases flow out of supply ports 11 and 12. Because the sapphire substrates 5 are thus positioned, the reaction chamber 1b as well is a conical space. Otherwise, this embodiment is similar to the foregoing embodiments. The parts of this embodiment that are similar to the counterparts in the foregoing embodiments are assigned the same reference numerals as the counterparts are assigned.

The foregoing arrangement enables the source gases to reach the sapphire substrates 5 in the most effective directions for the formation of reaction products, so that the gases are very high in crystallizability. The sapphire substrates 5 are supported on the conical partition plate 3a and inclined with respect to the axis of the exhaust duct 7. Consequently, after film formation, the gases flow smoothly toward the exhaust duct 7.

As described hereinbefore, supply ports for source gases are formed at places that are less subject to the radiation heat from a substrate or substrates to be processed, and the exhaust gas is sucked and discharged toward an exhaust duct after crystal film formation. This considerably increases the quantities of source gases consumed for the film formation. Thus, the gas crystallizability is high, and the film growth time is short. Accordingly, it is highly expected that a film forming apparatus according to the present invention can be used in this industrial field.

What is claimed is:

1. An apparatus for forming a film on a surface of a heated substrate by causing a plurality of source gases including at least a first source gas and a second source gas to react together, the apparatus comprising:

a processing chamber in which the substrate is placed;

the processing chamber divided into a heating chamber and a reaction chamber by at least the substrate so that the substrate surface can be exposed to the source gases in the reaction chamber;

an exhaust duct through which the exhaust gas can be discharged and having a sectional area with a first radius from a central axis of the exhaust duct;

the exhaust duct facing the exposed substrate surface and connecting with the reaction chamber;

a first supply port and a second supply port through which the first and second source gases respectively can be supplied independently into the reaction chamber and onto the substrate surface;

a placing region in which the substrate is placed, the sectional area of the exhaust duct is larger than an area of the substrate surface exposed in the reaction chamber as viewed along the central axis and having has a second radius from the central axis, the first and second supply ports positioned outside the radius of the sectional area of the exhaust duct taken from the central axis of the exhaust duct;

the first and second source gases being blown toward the substrate surface from the first and second supply ports outside of the second radius taken from the central axis of the area of the exposed substrate surface, the apparatus further comprising a peripheral wall with a surface radially outside of and adjacent to locations where the first and second supply ports communicate with the reaction chamber and acting as a partition so as to confine the source gases within a radial space bounded by the peripheral wall surface to thereby reduce quantities of source gases that do not function effectively in the reaction chamber; and an annular member having a top end and a bottom end with a surface that forms a part of the reaction chamber, the surface of the annular member widening from its bottom end towards its top end in the direction of the substrate and bounding the reaction chamber in conjunction with the surface of the peripheral wall that is located between the top and bottom ends of the annular member, the annular member connecting with the exhaust duct, the first and second supply ports each formed through the surface of the annular member, the surfaces of the annular and peripheral walls defining a solid, annular partition that radially confines the first and second gases from the first and second supply ports at the reaction chamber wherein the annular member and a part of the exhaust duct are part of an annular box, the annular box residing radially outside of the sectional area of the exhaust duct, the reaction chamber defined radially inside the annular box, the first and second supply ports each formed in the annular box.

2. The apparatus of claim 1 wherein:

the placing region in which the substrate is placed and the area of the exposed substrate surface are substantially circular;

the exhaust duct is substantially cylindrical and coaxial with the placing region.

3. The apparatus of claim 1 further comprising a first annular diffusion chamber and a second annular diffusion chamber for distributing the first and second source gases respectively to the first and second supply ports respectively.

4. The apparatus of claim 3 wherein the diffusion chambers surround the exhaust duct.

5. An apparatus for forming a film on a surface of a heated substrate by causing a plurality of source gases including at least a first source gas and a second source gas to react together, the apparatus comprising:

a processing chamber in which the substrate is placed;

the processing chamber divided into a heating chamber and a reaction chamber by at least the substrate so that the substrate surface can be exposed to the source gases in the reaction chamber;

an exhaust duct through which the exhaust gas can be discharged and having a sectional area with a first radius from a central axis of the exhaust duct;

the exhaust duct facing the exposed substrate surface and connecting with the reaction chamber;

a plurality of first supply ports and a plurality of second supply ports through which the first and second source gases respectively can be supplied independently into the reaction chamber and onto the substrate surface;

a placing region in which the substrate is placed, the sectional area of the exhaust duct is larger than an area of the substrate surface exposed in the reaction chamber as viewed along the central axis and having has a second radius from the central axis, the first and second supply ports positioned outside the radius of the sectional area of the exhaust duct taken from the central axis of the exhaust duct and alternating on a circumference;

the first and second source gases being blown toward the substrate surface from the first and second supply ports outside of the second radius taken from the central axis of the area of the exposed substrate surface, the apparatus further comprising a peripheral wall with a surface radially outside of and adjacent to locations where the first and second supply ports communicate with the reaction chamber and defining a solid, annular partition that radially confines the source gases within a radial space bounded by the peripheral wall surface to thereby reduce quantities of source gases that do not function effectively in the reaction chamber; and an annular member having a top end and a bottom end with a surface that forms a part of the reaction chamber, the surface of the annular member widening from its bottom end towards its top end in the direction of the substrate and bounding the reaction chamber in conjunction with the surface of the peripheral wall that is located between the top and bottom ends of the annular member, the annular member connecting with the exhaust duct, the first and second supply ports each formed through the annular member, the surfaces of the annular and peripheral walls radially confining the first and second gases from the first and second supply ports at the reaction chamber wherein the annular member and a part of the exhaust duct are part of an annular box, the annular box residing radially outside of the sectional area of the exhaust duct, the reaction chamber defined radially inside the annular box, the first and second supply ports each formed in the annular box.

6. The apparatus of claim 5 wherein the first and second supply ports are equally spaced.

7. The apparatus of claim 5 further comprising a first annular diffusion chamber and a second annular diffusion chamber for distributing the first and second source gases respectively to the first and second ports respectively.

8. An apparatus for forming films on surfaces of heated substrates by causing a plurality of source gases including at least a first source gas and a second source gas to react together, the apparatus comprising:

a processing chamber in which the substrates are placed;

the processing chamber divided into a heating chamber and a reaction chamber by at least the substrates so that the substrate surfaces can be exposed to the source gases in the reaction chamber;

an exhaust duct through which the exhaust gas can be discharged and having a sectional area with a first radius from a central axis of the exhaust duct;

the exhaust duct facing the exposed substrate surfaces and connecting with the reaction chamber;

first supply ports and second supply ports through which the first and second source gases respectively can be supplied independently into the reaction chamber and onto the substrate surfaces;

a placing region in which the substrate is placed, the sectional area of the exhaust duct is larger than an area of the substrate surface exposed in the reaction chamber as viewed along the central axis and has a second radius from the central axis, the first and second supply ports positioned outside the radius of the sectional area of the exhaust duct taken from the central axis of the exhaust duct;

the first and second source gases being blown toward the substrate surface from the first and second supply ports outside of the second radius taken from the central axis of the area of the exposed substrate surface, the substrates so positioned that the source gases supplied through each of the first supply ports and each of the second supply ports flow substantially perpendicularly to the surface of one of the substrates, the apparatus further comprising a peripheral wall with a surface radially outside of and adjacent to locations where the first and second supply ports communicate with the reaction chamber and acting as a partition so as to confine the source gases within a radial space bounded by the peripheral wall surface to thereby reduce quantities of source gases that do not function effectively in the reaction chamber; and an annular member having a top end and a bottom end with a surface that forms a part of the reaction chamber, the surface of the annular member widening from its bottom end towards its top end in the direction of the substrate and bounding the reaction chamber in conjunction with the surface of the peripheral wall that is located between the top and bottom ends of the annular member, the annular member connecting with the exhaust duct, the first and second supply ports each formed through the annular member, the surfaces of the annular and peripheral walls defining a solid, annular partition that radially confines the first and second gases from the first and second supply ports at the reaction chamber wherein the annular member and a part of the exhaust duct are part of an annular box, the annular box residing radially outside of the sectional area of the exhaust duct, the reaction chamber defined radially inside the annular box, the first and second supply ports each formed in the annular box.

* * * * *